United States Patent
Xie et al.

(10) Patent No.: US 11,742,354 B2
(45) Date of Patent: Aug. 29, 2023

(54) TOP EPITAXIAL LAYER AND CONTACT FOR VTFET

(71) Applicant: INTERNATIONAL BUSINESS MACHINES CORPORATION, Armonk, NY (US)

(72) Inventors: Ruilong Xie, Niskayuna, NY (US); Christopher J Waskiewicz, Rexford, NY (US); Alexander Reznicek, Troy, NY (US); Su Chen Fan, Cohoes, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 17/482,426

(22) Filed: Sep. 23, 2021

(65) Prior Publication Data

US 2023/0086681 A1    Mar. 23, 2023

(51) Int. Cl.
| | |
|---|---|
| *H01L 27/092* | (2006.01) |
| *H01L 29/06* | (2006.01) |
| *H01L 21/8238* | (2006.01) |
| *H01L 29/66* | (2006.01) |
| *H01L 29/78* | (2006.01) |

(52) U.S. Cl.
CPC .. *H01L 27/0924* (2013.01); *H01L 21/823821* (2013.01); *H01L 21/823878* (2013.01); *H01L 29/0649* (2013.01); *H01L 29/66795* (2013.01); *H01L 29/7851* (2013.01)

(58) Field of Classification Search
CPC ......... H01L 27/0924; H01L 21/823821; H01L 21/823878; H01L 29/0649; H01L 29/66795; H01L 29/7851; H01L 21/823487; H01L 21/823412; H01L 27/088; H01L 29/0847; H01L 29/41741;
(Continued)

(56) References Cited

U.S. PATENT DOCUMENTS

| | | |
|---|---|---|
| 5,365,097 A | 11/1994 | Kenney |
| 5,744,386 A | 4/1998 | Kenney |

(Continued)

FOREIGN PATENT DOCUMENTS

| | | |
|---|---|---|
| CN | 1222999 | 7/1999 |
| JP | 2011054885 A | 3/2011 |
| JP | 5629994 | 11/2014 |

*Primary Examiner* — Karen Kusumakar
*Assistant Examiner* — Adam S Bowen
(74) *Attorney, Agent, or Firm* — Jeffrey M. Ingalls

(57) ABSTRACT

A semiconductor device includes first and second vertical transport field-effect transistor (VTFET) devices. Each of the first and second VTFET devices includes a bottom epitaxial layer, a plurality of channel fins formed on the bottom epitaxial layer, a first interlayer dielectric (ILD) layer formed between the channel fins, a high-κ metal gate formed between the channel fins and the first ILD layer, a top epitaxial layer formed discretely on each of the channel fins, and a trench epitaxial layer formed continuously across the top epitaxial layer, a portion of the first ILD layer also being formed between the first and second VTFET device. The semiconductor device also includes a second ILD layer formed on the portion of the first ILD layer that is between the first and second VTFET devices, the second ILD layer separating the top epitaxial layers of the first and second VTFET devices.

19 Claims, 13 Drawing Sheets

(58) Field of Classification Search
CPC ........... H01L 29/7848; H01L 29/66666; H01L 29/7827
See application file for complete search history.

(56) References Cited

U.S. PATENT DOCUMENTS

| | | |
|---|---|---|
| 7,683,428 B2 | 3/2010 | Chidambarrao |
| 9,105,945 B2 | 8/2015 | Zhou |
| 10,153,367 B2 | 12/2018 | Cheng |
| 10,199,464 B2 | 2/2019 | Cheng |
| 10,340,363 B2 | 7/2019 | Lee |
| 10,347,759 B2 | 7/2019 | Anderson |
| 10,395,988 B1 | 8/2019 | Cheng |
| 10,777,679 B2 | 9/2020 | Lee |
| 10,937,883 B2 | 3/2021 | Lee |
| 10,943,903 B2 | 3/2021 | Lee |
| 2018/0204951 A1 | 7/2018 | Cheng |
| 2020/0066882 A1* | 2/2020 | Bi ..................... H01L 29/0847 |
| 2021/0408286 A1* | 12/2021 | More .............. H01L 21/823878 |

* cited by examiner

TOP EPITAXIAL LAYER AND CONTACT FOR VTFET

BACKGROUND

The present disclosure relates to semiconductor devices. In particular, the present disclosure relates to fabrication methods and resulting structures for top epitaxial layers and top contacts for vertical transport field-effect transistors (VTFETs).

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction.

VTFETs are becoming viable device options for smaller scale semiconductor devices, such as, for example, devices beyond the 7 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

VTFET devices provides viable solutions for transistor scaling. With current flowing in the vertical direction, the gate length and source/drain dimension are not limited by the lateral scaling.

SUMMARY

Embodiments of the present disclosure relate to a semiconductor device. The semiconductor device includes first and second vertical transport field-effect transistor (VTFET) devices. Each of the first and second VTFET devices includes a bottom epitaxial layer, a plurality of channel fins formed on the bottom epitaxial layer, a first interlayer dielectric (ILD) layer formed between the channel fins, a high-κ metal gate formed between the channel fins and the first ILD layer, a top epitaxial layer formed discretely on each of the channel fins, and a trench epitaxial layer formed continuously across the top epitaxial layer, a portion of the first ILD layer also being formed between the first and second VTFET device. The semiconductor device also includes a second ILD layer formed on the portion of the first ILD layer that is between the first and second VTFET devices, the second ILD layer separating the top epitaxial layers of the first and second VTFET devices.

Other embodiments relate to a method of fabricating a semiconductor device. The method includes forming first and second vertical transport field-effect transistor (VTFET) devices. Each of the first and second VTFET devices include a plurality of channel fins, a bottom epitaxial layer formed under the plurality of channel fins, a first interlayer dielectric (ILD) layer formed between the channel fins, a high-κ metal gate formed between the channel fins and the first ILD layer, a top epitaxial layer formed discretely on each of the channel fins, and a trench epitaxial layer formed continuously across the top epitaxial layer, a portion of the first ILD layer also being formed between the first and second VTFET device.

The method also includes forming a second ILD layer on the portion of the first ILD layer that is between the first and second VTFET devices, the second ILD layer separating the top epitaxial layers of the first and second VTFET devices.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
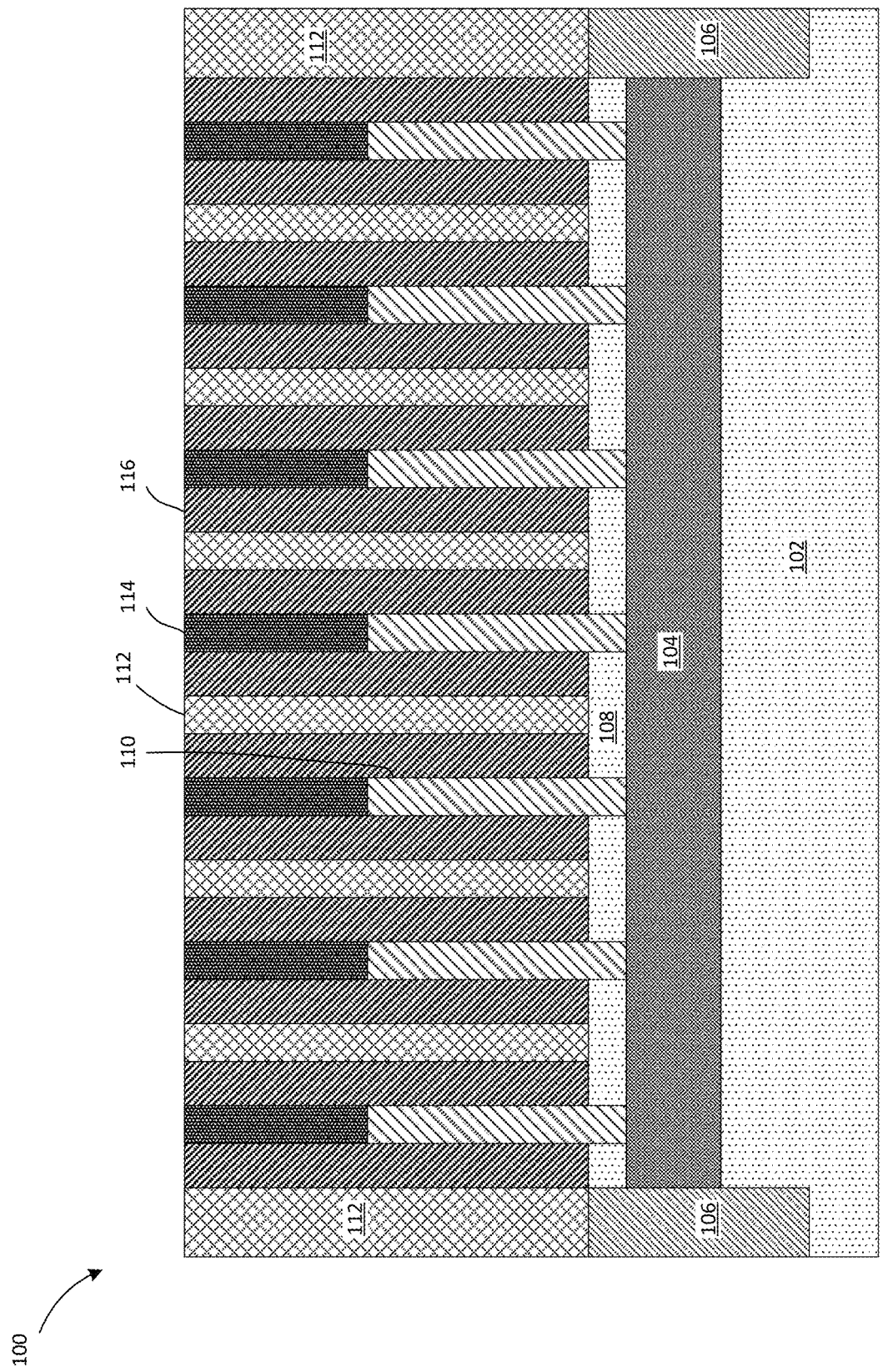
FIG. 1 is a cross-sectional view of a VTFET semiconductor device at an intermediate stage of the manufacturing process, according to embodiments.

Exemplary embodiments will now be discussed in further detail with regard to semiconductor devices and methods of manufacturing same and, in particular, to VTFET devices where a top epitaxial layer and trench epitaxial layer are provided that may reduce the occurrence of electrical shorting between devices.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present embodiments can be employed in applications, hardware, and/or electronic systems. Suitable hardware and systems for implementing embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of the embodiments provided herein, one of ordinary skill in the art will be able to contemplate other implementations and applications of the embodiments.

The present embodiments may be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of memory technologies that are more specifically relevant to aspects of the present disclosure, in certain VTFET devices, the contacted poly pitch (CPP) may become so small that there is the potential for electrical shorting between the top epitaxial layers of adjacent VTFET devices, or between the contacts of adjacent VTFET devices, or between a contact of one device and a top epitaxial layer of an adjacent device.

Referring now to the drawings in which like numerals represent the same or similar elements and initially to FIG. 1, an exemplary method of manufacturing a semiconductor device 100 that is a VTFET device is shown. As shown in FIG. 1, a substrate 102 is provided. The substrate 102 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide. As shown in FIG. 1, a hardmask 114 is formed on top of the fins 110. The hardmask 114 can be composed of various nitride materials including, but not limited to, a nitride, an oxide, silicon nitride (SiN), and/or a combination of a nitride material and an oxide material. After that, fins 110 (or channel fins) are patterned. The fins 110 may be formed by patterning a semiconductor layer into the fins 110. The semiconductor layer can include, but is not necessarily limited to, Si, SiGe or III-V materials, and may be epitaxially grown. The fin 110 patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited to, an oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin 110 patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments describe channel regions as fins, the embodiments are not necessarily limited to fin channel regions, and may include nanowire channel regions. In addition, although seven fins 110 are shown in the figures for ease of explanation, more or less than seven fins can be formed As shown in FIG. 1, a bottom epitaxial layer 104 is epitaxially formed on the substrate 102. In certain examples, a sacrificial protecting liner (not shown) can be formed over the fin 110 and the fin hardmask 114 sidewall before forming the bottom S/D epi. According to an embodiment, the bottom epitaxial layer 104 (or bottom source/drain regions) includes, if it is a pFET boron doped SiGe or Si (less preferred), or if it is an nFET phosphorus or arsenic doped silicon. However, it should be appreciated that other suitable materials may be used for the bottom epitaxial layer 104. Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 400° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

The semiconductor device 100 also includes isolation regions 106 (e.g., shallow trench isolation (STI) regions) formed in recessed portions of the substrate 102. The isolation regions 106 include dielectric material, such as, but not necessarily limited to, $SiO_x$, SiOC, SiOCN or some other suitable dielectric material. Shallow trench isolation (STI), also known as box isolation technique, is an integrated circuit feature which prevents electric current leakage between adjacent semiconductor device components. STI is generally used on complementary metal-oxide-semiconductor (CMOS) process technology nodes of 250 nanometers and smaller. In general, STI regions are created early during the semiconductor device fabrication process, before transistors are formed. The key steps of the STI process involve etching a pattern of trenches in the silicon, depositing one or more dielectric materials (such as silicon dioxide) to fill the trenches, and removing the excess dielectric using a technique such as chemical-mechanical planarization.

A bottom spacer layer 108 is formed on the bottom epitaxial layer 104 and below high-κ metal gate 116 layers for the NFET and PFET regions. The bottom spacer layer 108 may include, but is not necessarily limited to, silicon boron nitride (SiBN), siliconborocarbonitride (SiBCN), silicon oxycarbonitride (SiOCN), silicon nitride (SiN) or silicon oxide ($SiO_x$), where x is, for example, 2 in the case of silicon dioxide ($SiO_2$), or 1.99 or 2.01. According to an embodiment, the bottom spacer layer 108 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be overfilled, followed by CMP and dielectric recess processes.

A high-κ metal gate 116 layer is provided on both sides of the fins 110. Materials of the high-κ metal gate 116 may include, for example, high-κ materials, such as hafnium dioxide ($HfO_2$), zirconium dioxide ($ZrO_2$) and titanium dioxide ($TiO_2$). The high-κ metal gate 116 may be deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), sputtering. After high-κ dielectric deposition, workfunction metals (WFM) are deposited. Examples of WFM include, TiN, TiC, TiAlC, TaN, etc. After that, the high-κ metal gate 116 is patterned such that unwanted portions of the high-κ metal gate 116 may be etched away.

As shown in FIG. 1, an interlayer dielectric (ILD) 112 layer (or first ILD layer) is formed between the high-κ metal gate 116. The ILD layer 112 may include any suitable insulating ILD material(s), such as SiN, $SiO_2$, or combination of a thin SiN liner and $SiO_2$ fill. In certain examples, as shown in FIG. 1, a CMP process may be performed on the semiconductor device 100 to planarize the top surfaces of the ILD layer 112, the high-κ metal gate 116 and the hardmask 114.

Figure 2:
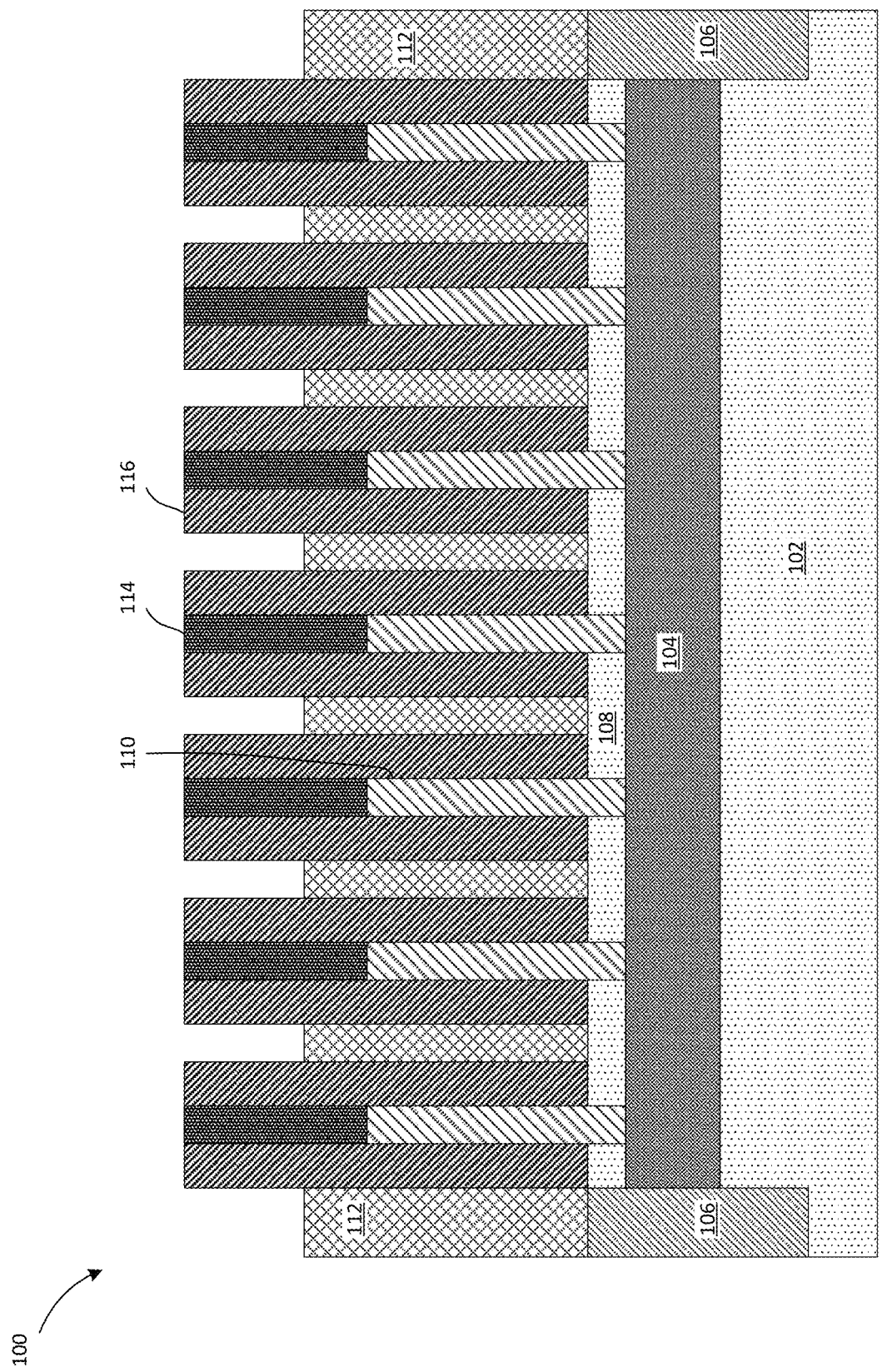
FIG. 2 is a cross-sectional view of the VTFET semiconductor device of FIG. 1 after additional fabrication operations, according to embodiments.

Referring now to FIG. 2, this figure is a cross-sectional view of the VTFET semiconductor device 100 of FIG. 1 after additional fabrication operations, according to embodiments. As shown in FIG. 2, etching is performed to remove a portion of the ILD layer 112. In certain examples, the ILD layer 112 is removed to a depth that is above a top surface of the fins 110. It should be appreciated that the removal of the ILD material may be according to any suitable combination of wet or dry etching techniques discussed herein.

Figure 3:
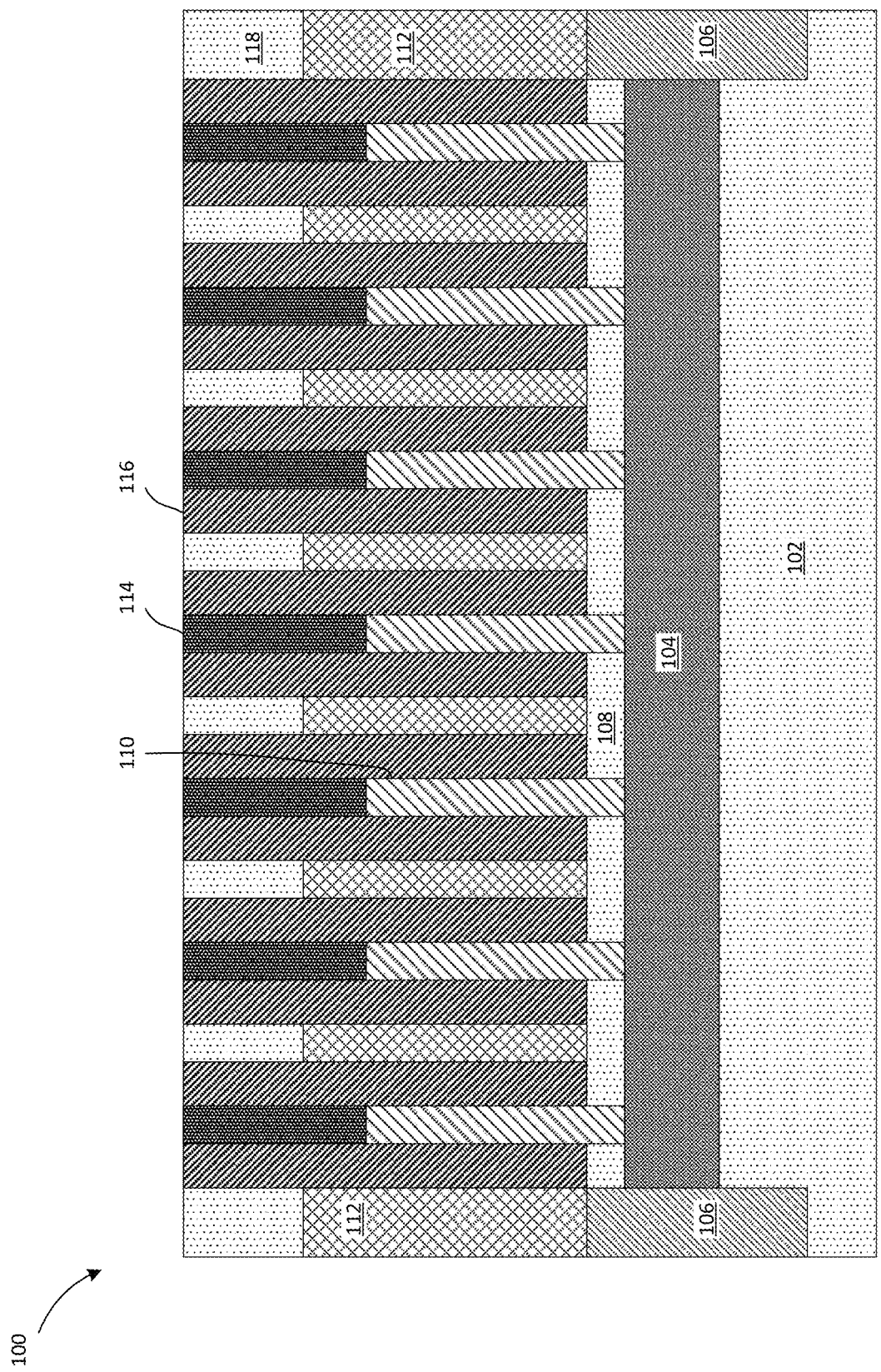
FIG. 3 is a cross-sectional view of the VTFET semiconductor device of FIG. 2 after additional fabrication operations, according to embodiments.

Referring now to FIG. 3, this figure is a cross-sectional view of the VTFET semiconductor device 100 of FIG. 2 after additional fabrication operations, according to embodiments. As shown in FIG. 3, following the removal of the portions of the ILD layer 112, a dielectric fill layer 118 is deposited in the spaces left by the removal of the ILD layer 112 material. In certain examples, the material of the dielectric fill layer 118 is different than the material of the ILD layer 112. In certain examples, the material of the dielectric fill layer 118 may be SiC or SiOC. In some embodiments, a planarization process, such as, chemical mechanical planarization (CMP) can be used to remove excess material of the dielectric fill layer 118 using the hardmask 114 as a stopping point.

Figure 4:
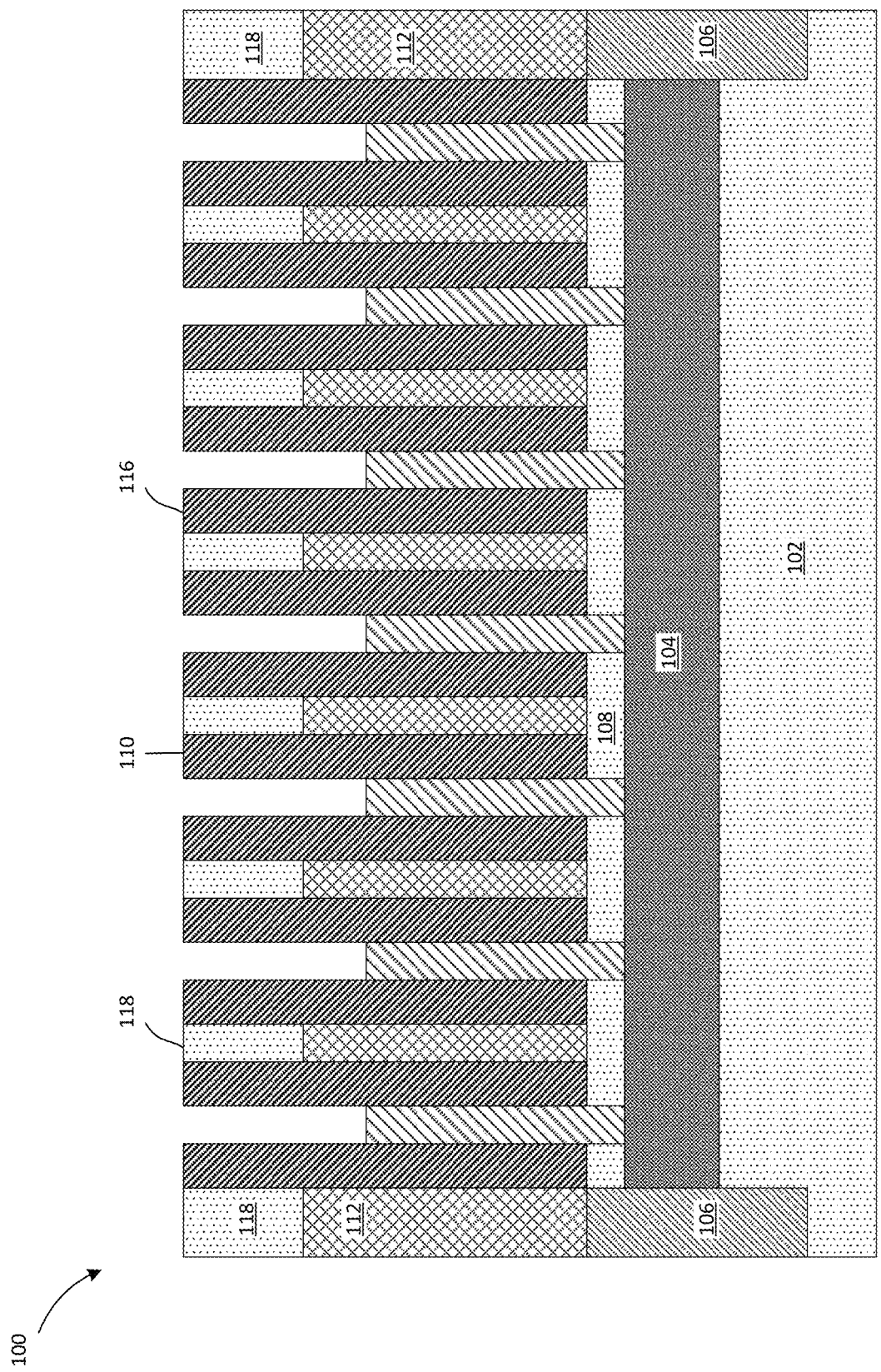
FIG. 4 is a cross-sectional view of the VTFET semiconductor device of FIG. 3 after additional fabrication operations, according to embodiments.

Referring now to FIG. 4, this figure is a cross-sectional view of the VTFET semiconductor device 100 of FIG. 3 after additional fabrication operations, according to embodiments. As shown in FIG. 4, the hardmask 114 is removed with a suitable etching technique. In certain examples (e.g., where the material of the hardmask 114 is SiN and the material of the dielectric fill layer 118 is SiC) an appropriate etchant is selected so that the material of the hardmask 114 is removed without significantly affecting removal of the material of the dielectric fill layer 118.

Figure 5:
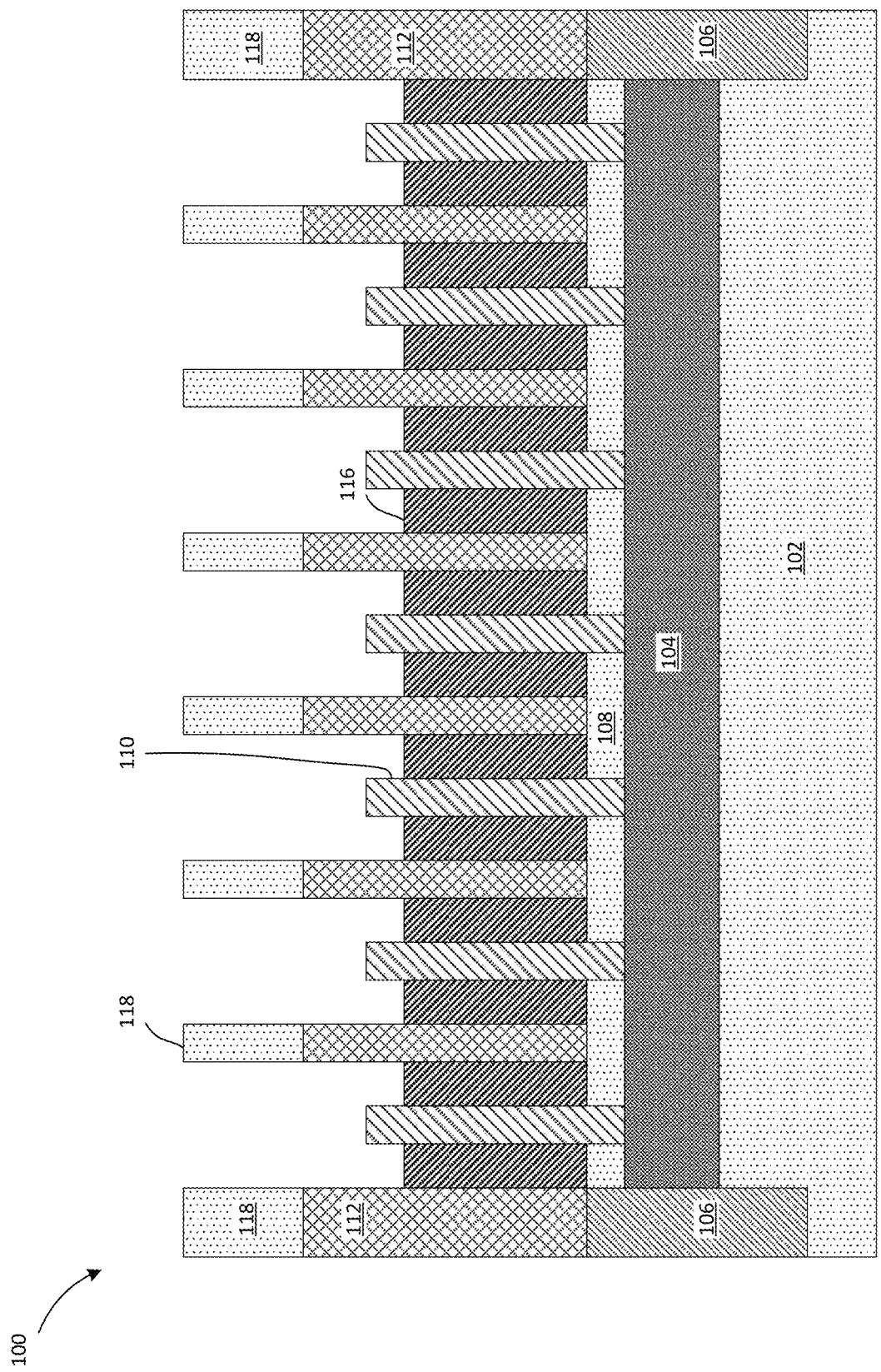
FIG. 5 is a cross-sectional view of the VTFET semiconductor device of FIG. 4 after additional fabrication operations, according to embodiments.

Referring now to FIG. 5, this figure is a cross-sectional view of the VTFET semiconductor device 100 of FIG. 4 after additional fabrication operations, according to embodiments. As shown in FIG. 5, after the removal of the hardmask 114, the high-κ metal gate 116 layer is recessed using any suitable etching technique. In this example, the high-κ metal gate 116 layer is recessed to depth (or level) that is below an upper surface of the fins 110, thus leaving a portion of the fins 110 stickup up above the recessed surface of the high-κ metal gate 116 layer.

Figure 6:
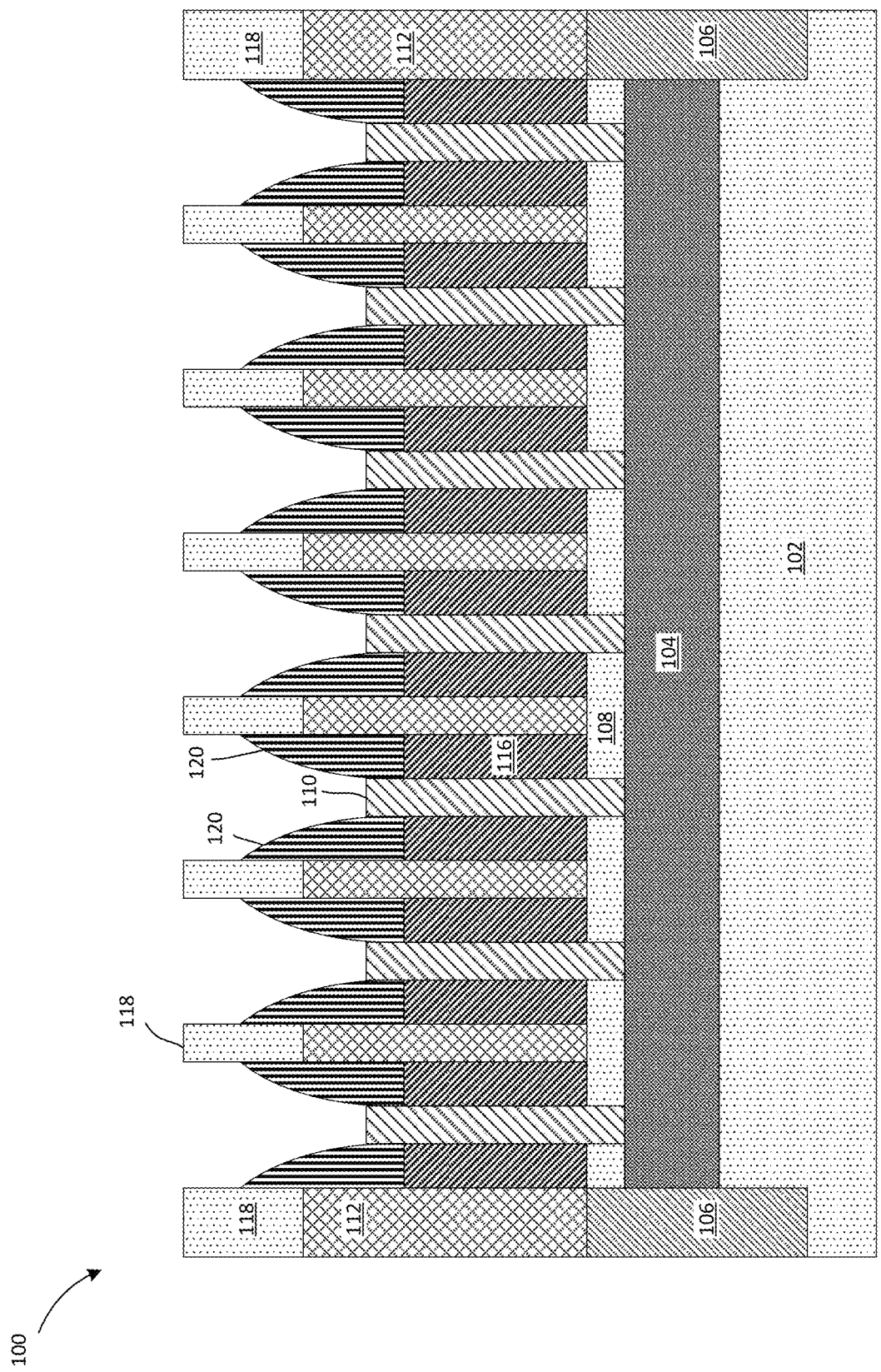
FIG. 6 is a cross-sectional view of the VTFET semiconductor device of FIG. 5 after additional fabrication operations, according to embodiments.

Referring now to FIG. 6, this figure is a cross-sectional view of the VTFET semiconductor device 100 of FIG. 5 after additional fabrication operations, according to embodiments. As shown in FIG. 6, a spacer layer 120 is formed on the high-κ metal gate 116 layer. In certain examples, the spacer layer 120 may be formed by first depositing material and then etching back the spacer layer 120 to form the curved or slanted shape seen in FIG. 6. However, it should be appreciated that it is not necessary to have a curved or slanted side profile shape for the spacer layer 120, and other shapes are contemplated in the present embodiments. In the example shown in FIG. 6, the spacer layer 120 also covers the side surfaces of the protruding portion of the fins 110 (i.e., the portion of the fins 110 that rises above the high-κ metal gate 116 layer), the side surfaces of the protruding portion of the ILD layer 112 (i.e., the portion of the ILD layer 112 that rises above the upper surface of the high-κ metal gate layer 116), and partially covers the side surfaces of the dielectric fill layer 120.

Figure 7:
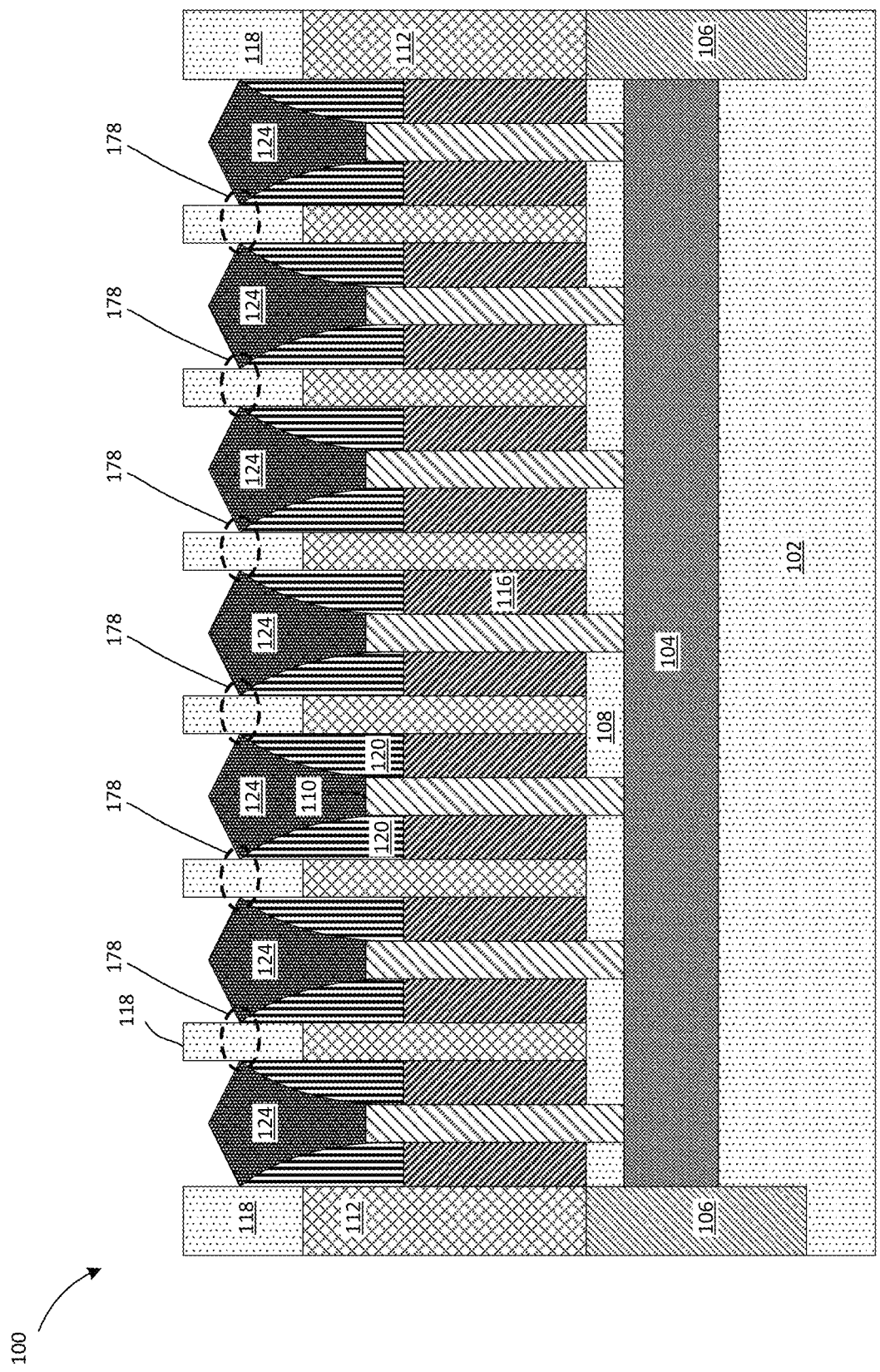
FIG. 7 is a cross-sectional view of the VTFET semiconductor device of FIG. 6 after additional fabrication operations, according to embodiments.

Referring now to FIG. 7, this figure is a cross-sectional view of the VTFET semiconductor device 100 of FIG. 6 after additional fabrication operations, according to embodiments. As shown in FIG. 7, a top source/drain (S/D) epitaxial layer 124 is formed over the fins 110 in the space between the spacer layers 120. In certain examples, the top epitaxial layer can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$.

As shown in FIG. 7, one effect that may be achieved from the embodiments is that the material of the dielectric fill layer 118 (e.g., SiC or SiOC) material is not $SiO_2$, and it can survive a pre-epitaxial growth cleaning process, and therefore effectively give additional height to the ILD layer 112. That is, if the ILD layer 112 was taller (i.e., rather than forming the dielectric fill layer 118 on top of the ILD layer 112), the oxide based ILD layer 112 may be subject to thinning or partial destruction prior to epitaxial growth (which could lead to epi to epi shorts). However, the dielectric fill layer 118 is resistant to the pre-epitaxial growth cleaning process. In other words, the dielectric fill layer 118 can effectively prevent excess lateral (i.e., in a direction parallel to the plane of the substrate 102) epitaxial growth of the top epitaxial layer 124 in region 178. As discussed above, excess lateral growth of the top epitaxial layer 124 in related VTFET devices can be a cause of epi-epi, epi-contact, and/or contact-contact electrical shorting. Thus, the dielectric fill layer 118 can minimize or prevent this type of shorting.

Figure 8:
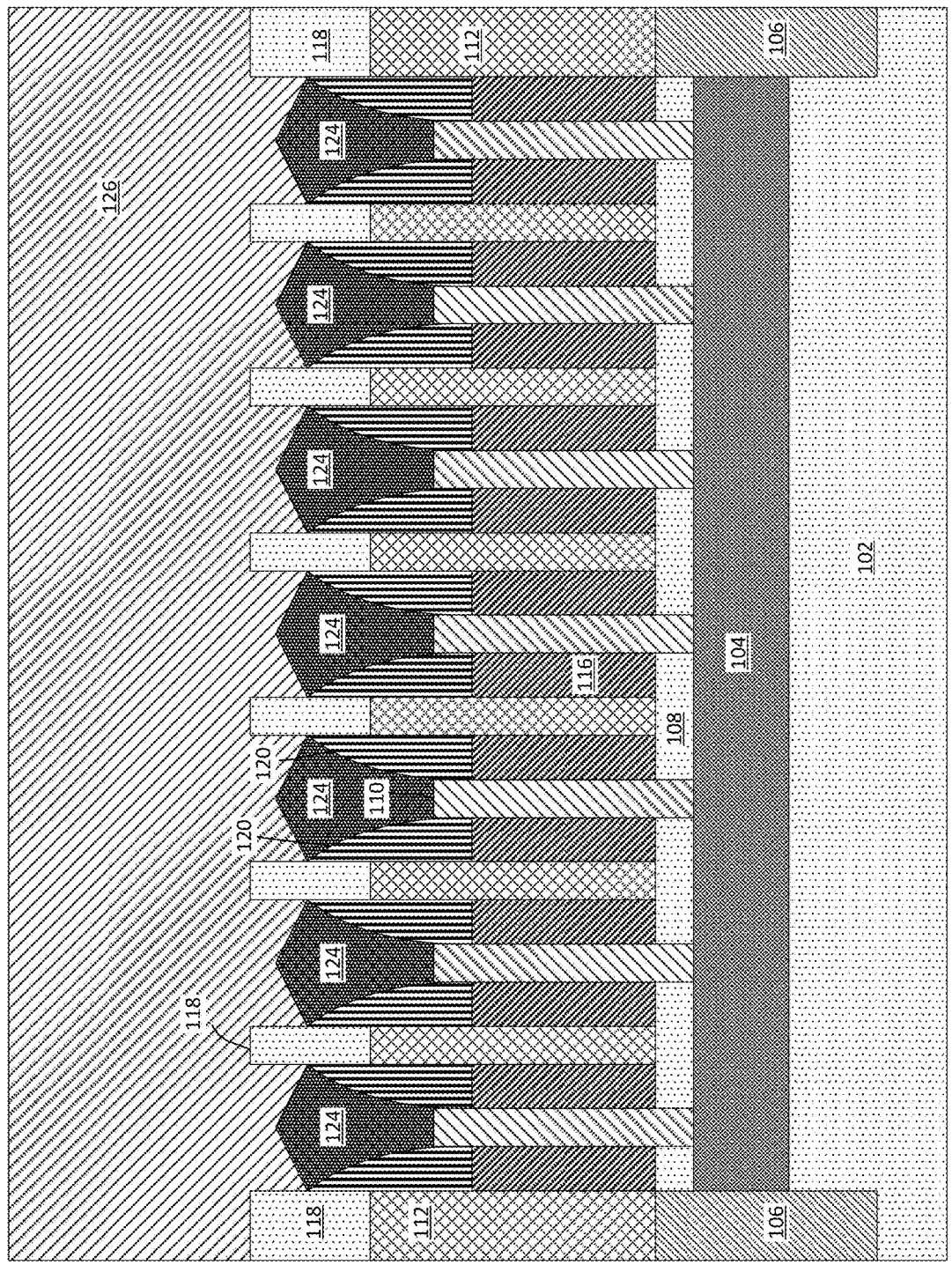
FIG. 8 is a cross-sectional view of the VTFET semiconductor device of FIG. 7 after additional fabrication operations, according to embodiments.

Referring now to FIG. 8, this figure is a cross-sectional view of the VTFET semiconductor device 100 of FIG. 7 after additional fabrication operations, according to embodiments. As shown in FIG. 8, after the formation of the top epitaxial layer 124, a second ILD layer 126 is formed over the entire semiconductor device 100. The material of the second ILD layer 126 may be comprised of any suitable dielectric material(s), and may be the same material or a different material than that of ILD layer 112. In certain embodiments, the ILD layer 112 has etching selectivity relative to the second ILD layer 126.

Figure 9:
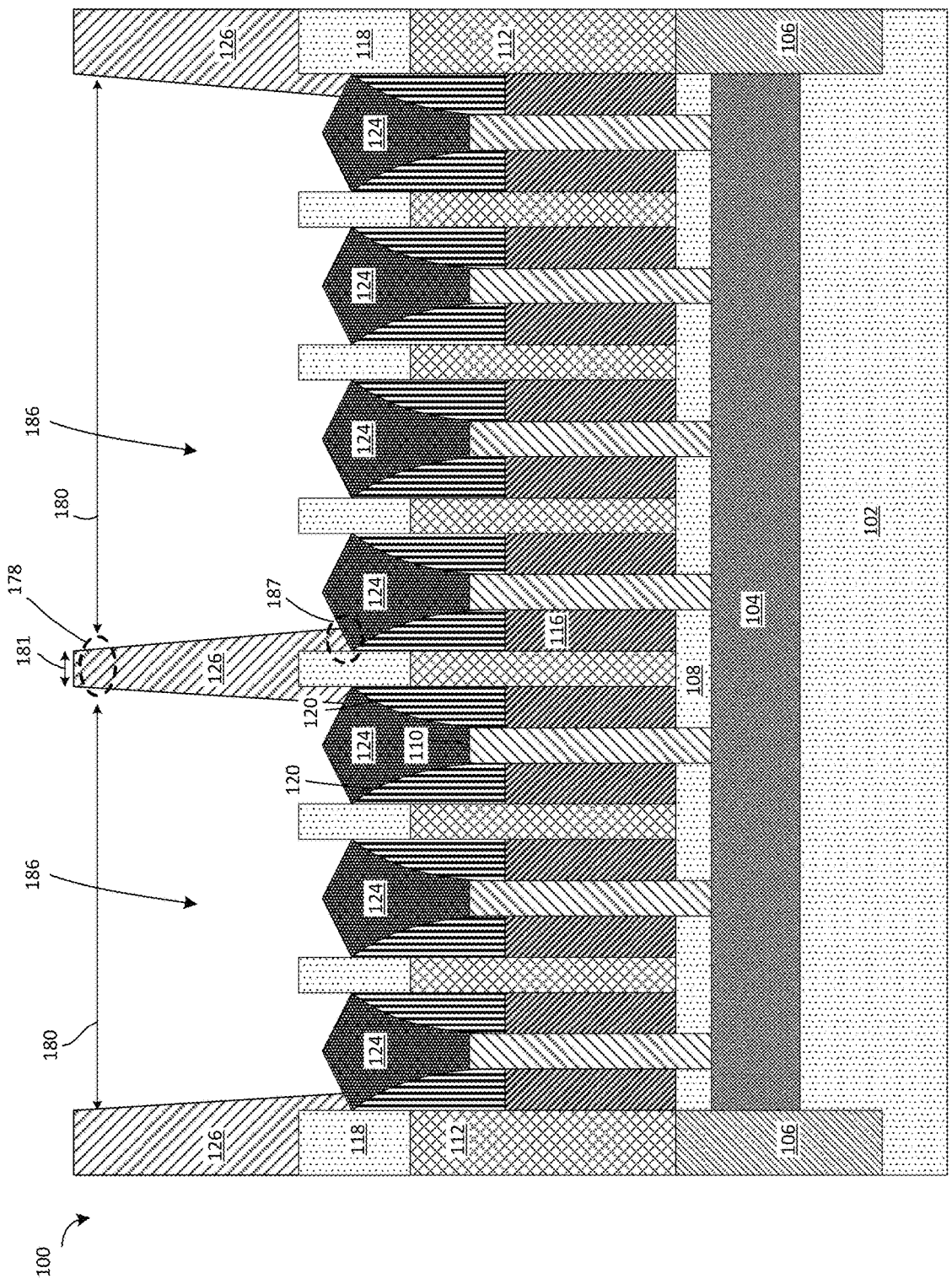
FIG. 9 is a cross-sectional view of the VTFET semiconductor device of FIG. 8 after additional fabrication operations, according to embodiments.

Referring now to FIG. 9, this figure is a cross-sectional view of the VTFET semiconductor device 100 of FIG. 8 after additional fabrication operations, according to embodiments. As shown in FIG. 9, after the formation of the second ILD layer 126, contact vias/trenches are etched into the second ILD layer 126, thereby exposing most of the upper surfaces of the top epitaxial layer 124 (note that some material of the second ILD layer 126 still covers the epitaxial layer 124 in ILD overlap region 187). One concern when forming the top epitaxial layer 124 is to have sufficient surface contact area between the top surface of the epitaxial layer 124 with the later formed contact metallization layer 128 (see FIG. 11). There may be a desire to form smaller contact vias 186 so that there is sufficient material of the second ILD layer 126 (e.g., in ILD region 178 as indicated by the second ILD width 181) to prevent contact-contact shorting between adjacent contact metallization layers 128. In other words, if the second ILD width 181 is too small, the adjacent contact metallization layers 128 may touch, thereby causing a short. However, when decreasing the critical dimension of the contact vias 186, this may cause more material of the remaining second ILD layer 126 to cover the top surface of the top epitaxial layer 124 in ILD overlap region 187. It may thus be desirable to try and increase the amount of surface are of the top epitaxial layer 124, and methods of accomplishing this are described with reference to FIGS. 10 and 11 below.

Figure 10:
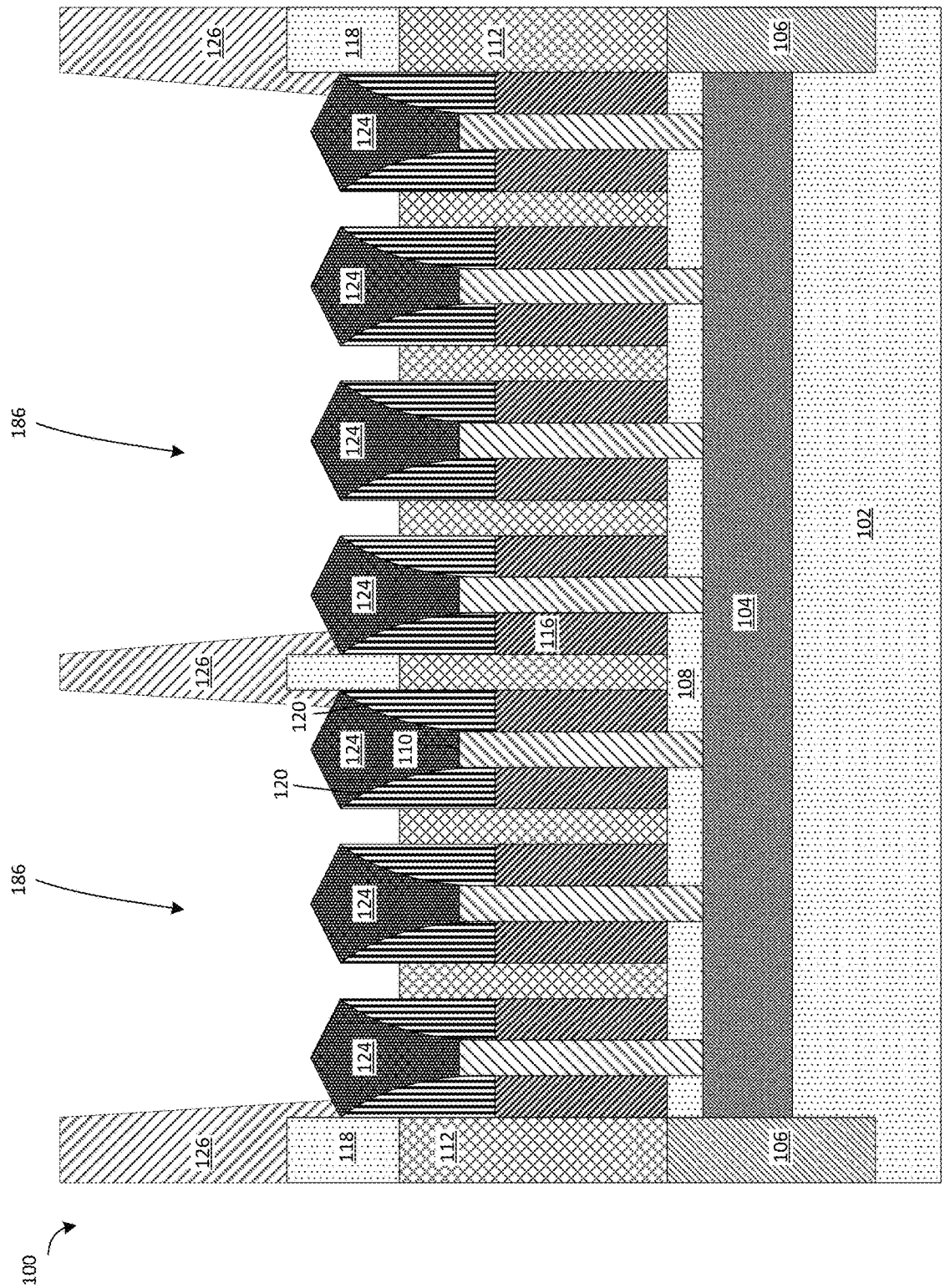
FIG. 10 is a cross-sectional view of the VTFET semiconductor device of FIG. 9 after additional fabrication operations, according to embodiments.

Referring now to FIG. 10, this figure is a cross-sectional view of the VTFET semiconductor device of FIG. 9 after additional fabrication operations, according to embodiments. As shown in FIG. 10, after the formation of the contact vias 186 in the second ILD layer 126, the dielectric fill layer 118 is removed in the areas corresponding to the contact vias 186 (i.e., the dielectric fill layer 118 still remains in areas between adjacent VTFET devices and embedded within the second ILD layer 126). One effect of having, for example, A selective etch can be used to remove the dielectric fill layer 118 with respect to the top epitaxial layers 124, the ILD layer 112 and the second ILD layer 126. Thus, when removing the dielectric fill layer 118, there is minimal risk of removing too much of the underlying ILD layer 112, which could potentially lead to an electrical short between the contact metallization layer 128 (see FIG. 11) and the high-κ metal gate 116. At this stage, the top epitaxial layer 124 is more exposed.

Figure 11:
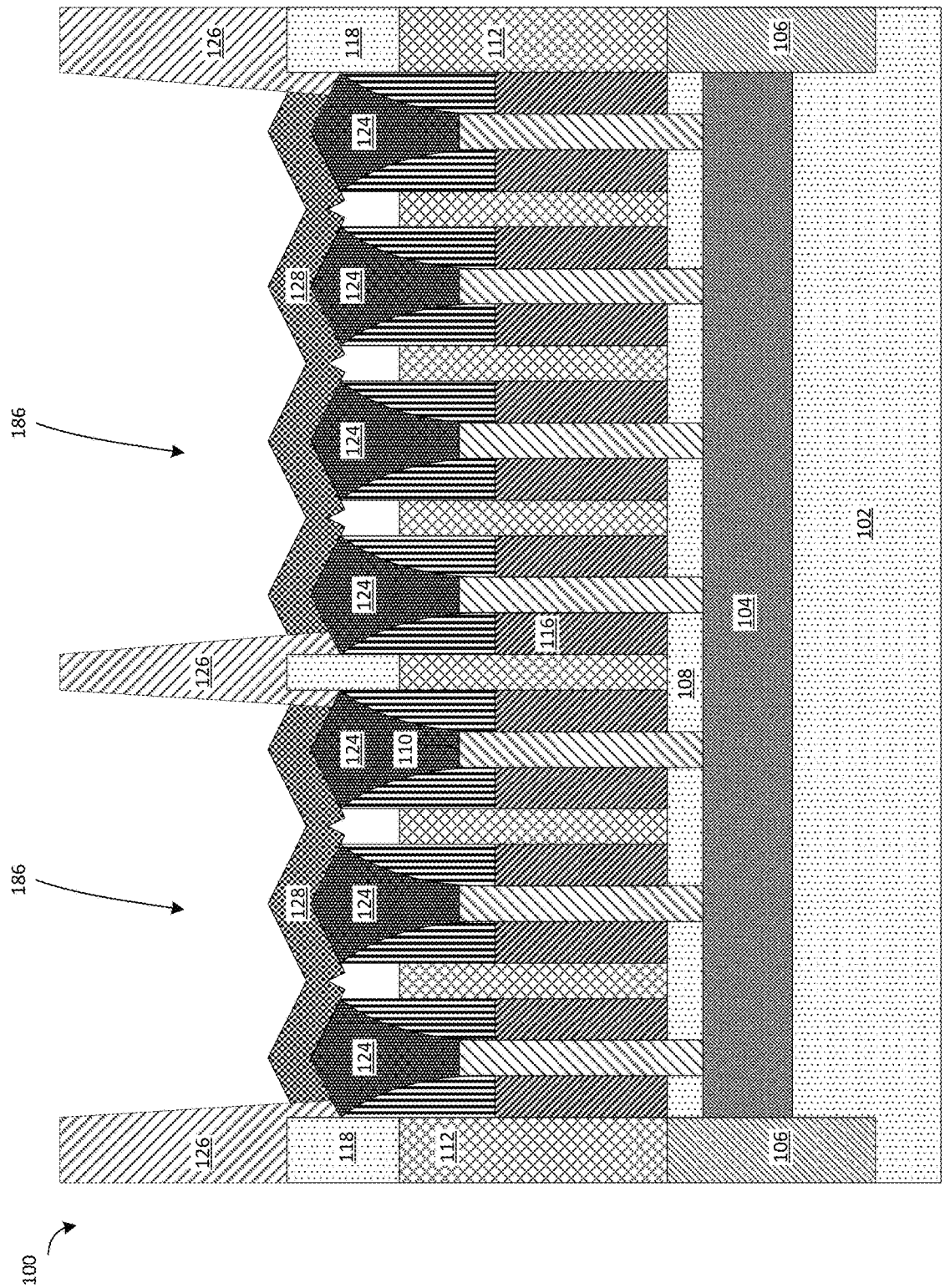
FIG. 11 is a cross-sectional view of the VTFET semiconductor device of FIG. 10 after additional fabrication operations, according to embodiments.

Referring now to FIG. 11, this figure is a cross-sectional view of the VTFET semiconductor device of FIG. 10 after additional fabrication operations, according to embodiments. As shown in FIG. 11, a trench epitaxial layer 128 is grown on top of the top epitaxial layer 124. The trench epitaxial layer 128 is grown until the portions meet to form a continuous layer across the entire width of the contact via 186 area. Thus, the area of the top surface of the trench epitaxial layer 128 is greater than the sum of the exposed top surfaces of the top epitaxial layers 124 shown in FIG. 10. Thus, there is an effect of increasing the total top surface area of the top epitaxy layer (i.e., and thus to compensate for the surface area of the top epitaxial layer 124 that is lost to the second ILD layer 126 in the ILD overlap area 187). This may enable a reduction in the contact resistance (Rc) between the top epitaxy and the top contact. In certain examples, airgaps may exist between the trench epitaxial layer 128 and the ILD layer 112.

Figure 12:
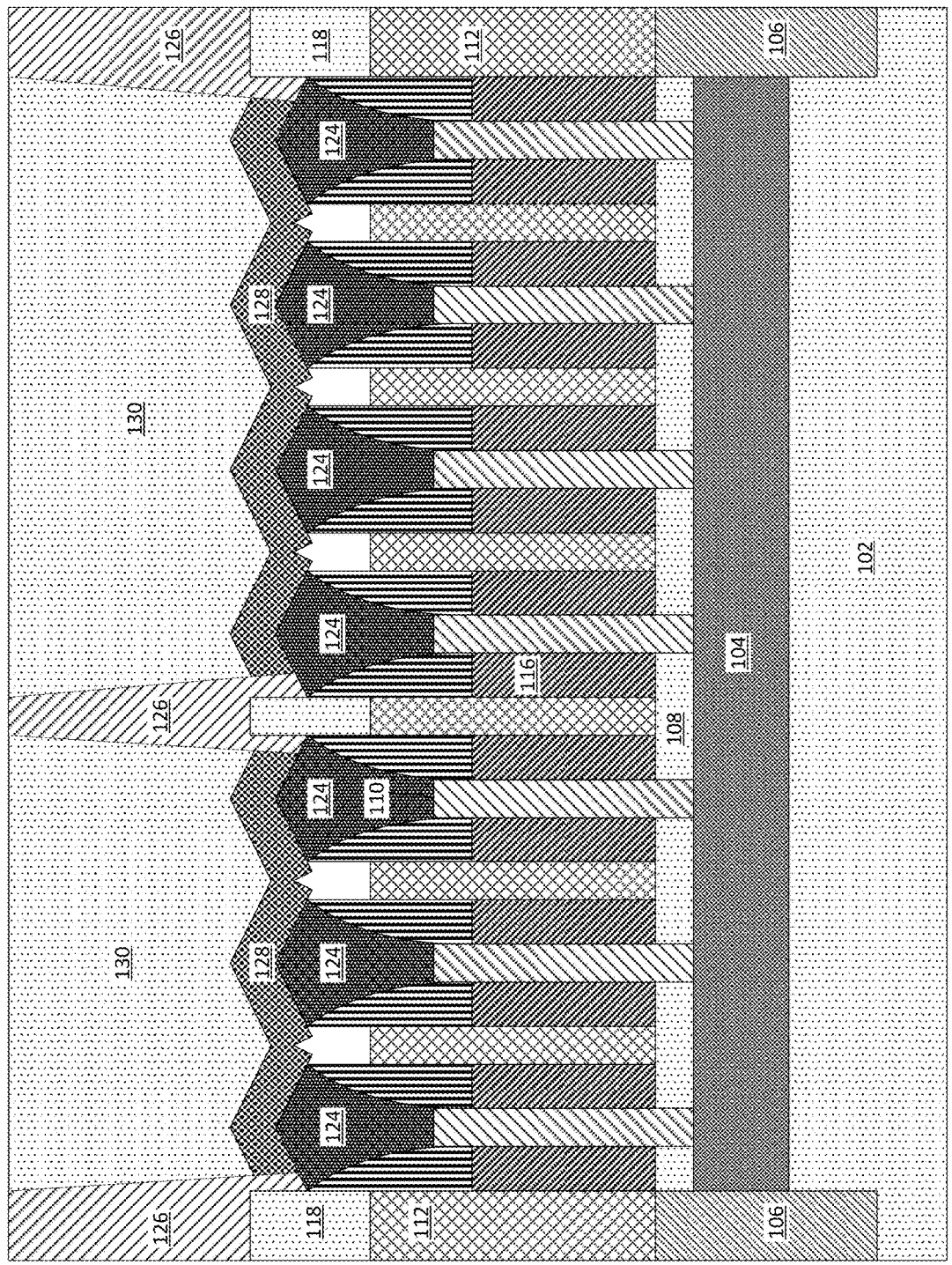
FIG. 12 is a cross-sectional view of the VTFET semiconductor device of FIG. 11 after additional fabrication operations, according to embodiments.

Referring now to FIG. 12, this figure is a cross-sectional view of the VTFET semiconductor device of FIG. 11 after additional fabrication operations, according to embodiments. As shown in FIG. 12, after the formation of the trench epitaxial layer 128 is formed, a contact metallization 130 is formed on the trench epitaxial layer 128.

Figure 13:
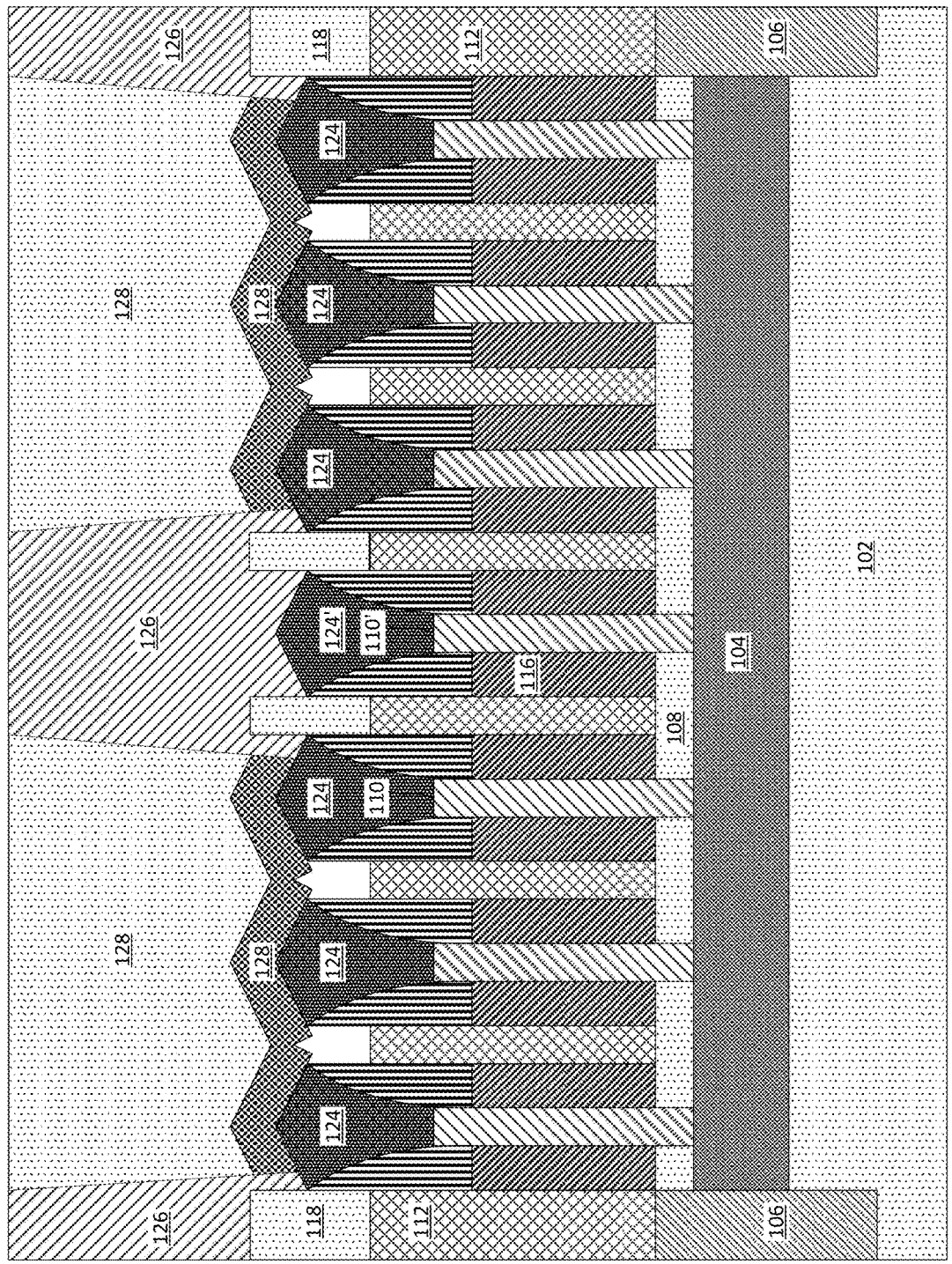
FIG. 13 is a cross-sectional view of a VTFET semiconductor device at an intermediate stage of the manufacturing process where the semiconductor device includes a dummy fin, according to embodiments.

Referring now to FIG. 13, this figure is a cross-sectional view of a VTFET semiconductor device 200 at an intermediate stage of the manufacturing process, according to embodiments. As shown in FIG. 13, the semiconductor device 200 is similar in most respects to the embodiments described above with respect to FIGS. 1-12. However, in FIG. 13, there is a dummy fin 110' between adjacent VTFET devices. Moreover, a dummy top epitaxial layer 124' is formed on the dummy fin 110'. As shown in FIG. 13, there is no trench epitaxial layer formed on the top epitaxial layer 124'.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    first and second vertical transport field-effect transistor (VTFET) devices, each of the first and second VTFET devices including
        a bottom epitaxial layer,
        a plurality of channel fins formed on the bottom epitaxial layer,
        a bottom spacer layer formed on the bottom epitaxial layer,
        a first interlayer dielectric (ILD) layer formed on the bottom spacer layer and between the channel fins,
        a high-κ metal gate formed on the bottom spacer layer and between the channel fins and the first ILD layer,
        a top epitaxial layer formed discretely on each of the channel fins, and
        a trench epitaxial layer formed continuously across the top epitaxial layer, a portion of the first ILD layer also being formed between the first and second VTFET device.

2. The semiconductor device of claim 1, wherein airgaps exist between the trench epitaxial layer and the first ILD layer.

3. The semiconductor device of claim 1, further comprising:
    a second ILD layer formed on the portion of the first ILD layer that is between the first and second VTFET devices, the second ILD layer separating the top epitaxial layers of the first and second VTFET devices; and
    a third ILD layer formed on the second ILD layer.

4. The semiconductor device of claim 3, wherein the third ILD layer separates the trench epitaxial layers of the first and second VTFET devices.

5. The semiconductor device of claim 3, wherein the first ILD layer has etching selectivity relative to the second ILD layer.

6. The semiconductor device of claim 5, wherein the second ILD layer comprises SiC or SiOC.

7. The semiconductor device of claim 1, further comprising a top spacer layer formed between the top epitaxial layer and the first ILD layer.

8. The semiconductor device of claim 1, wherein a height of the fins is greater than a height of the high-κ metal gate layer.

9. The semiconductor device of claim 8, wherein a height of the first ILD layer is greater than the height of the channel fins.

10. A method of fabricating a semiconductor device, the method comprising:
    forming first and second vertical transport field-effect transistor (VTFET) devices by
        forming a bottom epitaxial layer,
        forming a plurality of channel fins on the bottom epitaxial layer,
        forming a bottom spacer layer on the bottom epitaxial layer,
        forming a first interlayer dielectric (ILD) layer on the bottom spacer layer and between the channel fins,
        forming a high-κ metal gate between the channel fins and the first ILD layer,
        forming a top epitaxial layer discretely on each of the channel fins, and
        forming a trench epitaxial layer continuously across the top epitaxial layer, a portion of the first ILD layer also being formed between the first and second VTFET device.

11. The method of claim 10, wherein forming the first and second VTFET devices further comprises:
    forming a fin hardmask on the plurality of channel fins; and
    forming STI regions on sides of the bottom epitaxial layer.

12. The method of claim 11, wherein forming the first and second VTFET devices further comprises:
    recessing the first ILD layer to a level that is higher than a height of the channel fins.

13. The method of claim 12, wherein forming the first and second VTFET devices further comprises:
    forming a second ILD layer on the portion of the first ILD layer that is between the first and second VTFET devices;
    removing the fin hardmask;
    recessing the high-κ metal gate to a level that is lower than the height of the channel fins;
    forming a top spacer layer between the first and second ILD layers and the channel fins; and
    forming the top epitaxial layer discretely on each of the channel fins and between the second ILD layers, the second ILD layer separating the top epitaxial layers of the first and second VTFET devices.

14. The method of claim 13, wherein forming the first and second VTFET devices further comprises:
    forming a third ILD layer;
    forming contact vias in the third ILD layer to expose the second ILD layer and the top epitaxial layer; and
    removing the second ILD in areas corresponding to the contact vias.

15. The method of claim 14, wherein the third ILD layer separates the trench epitaxial layers of the first and second VTFET devices.

16. The method of claim 14, further comprising forming a contact metallization on the trench epitaxial layer.

17. The method of claim 14, wherein a portion of the third ILD layer covers a portion of the top epitaxial layer.

18. The method of claim 13, wherein the first ILD layer has etching selectivity relative to the second ILD layer.

19. The method of claim 18, wherein the second ILD layer comprises SiC or SiOC.

* * * * *